US008568962B2

(12) United States Patent
Hermans et al.

(10) Patent No.: US 8,568,962 B2
(45) Date of Patent: Oct. 29, 2013

(54) PROCESS FOR PREPARING A POLYMERIC RELIEF STRUCTURE

(75) Inventors: Ko Hermans, Eindhoven (NL); Itsuro Tomatsu, Leiden (NL); Rintje Pieter Sijbesma, Eindhoven (NL); Cornelis Wilhelmus Maria Bastiaansen, Eindhoven (NL); Jan Dirk Broer, Eindhoven (NL)

(73) Assignee: Stichting Dutch Polymer Institute, Eindhoven (NL)

(*) Notice: Subject to any disclaimer, the term of this patent is extended or adjusted under 35 U.S.C. 154(b) by 101 days.

(21) Appl. No.: 12/936,896

(22) PCT Filed: Apr. 7, 2009

(86) PCT No.: PCT/EP2009/054161
§ 371 (c)(1),
(2), (4) Date: Dec. 27, 2010

(87) PCT Pub. No.: WO2009/124942
PCT Pub. Date: Oct. 15, 2009

(65) Prior Publication Data
US 2011/0104445 A1  May 5, 2011

(30) Foreign Application Priority Data

Apr. 7, 2008 (EP) .................................. 08103401

(51) Int. Cl.
G03F 7/38 (2006.01)
(52) U.S. Cl.
USPC ............................. 430/321; 430/320; 430/325
(58) Field of Classification Search
None
See application file for complete search history.

(56) References Cited

U.S. PATENT DOCUMENTS

| | | | | |
|---|---|---|---|---|
| 5,476,752 A | | 12/1995 | Noguchi et al. | |
| 5,729,319 A | * | 3/1998 | Inou et al. | 349/156 |
| 6,117,920 A | * | 9/2000 | Jolliffe et al. | 522/170 |
| 2002/0150698 A1 | * | 10/2002 | Kawabata | 428/1.1 |
| 2005/0075247 A1 | * | 4/2005 | Kakino et al. | 503/201 |
| 2005/0096440 A1 | * | 5/2005 | Lo et al. | 526/172 |
| 2007/0072088 A1 | * | 3/2007 | Yumoto et al. | 430/1 |
| 2007/0139589 A1 | * | 6/2007 | Roosendaal et al. | 349/114 |
| 2007/0254208 A1 | * | 11/2007 | Kurt et al. | 429/126 |
| 2008/0131626 A1 | * | 6/2008 | Bastiaansen et al. | 428/29 |
| 2008/0278675 A1 | * | 11/2008 | Escuti et al. | 349/201 |
| 2010/0028816 A1 | * | 2/2010 | Hermans et al. | 430/325 |
| 2010/0279074 A1 | * | 11/2010 | Perelaer et al. | 428/172 |
| 2012/0033173 A1 | * | 2/2012 | Broer et al. | 349/199 |

FOREIGN PATENT DOCUMENTS

| | | | |
|---|---|---|---|
| EP | 613050 | * | 8/1994 |
| GB | 2394718 | * | 5/2004 |
| JP | 2003-280187 | * | 10/2003 |
| WO | 2006/051484 | * | 5/2006 |
| WO | 2006/064420 | * | 6/2006 |
| WO | 2008/025508 | * | 3/2008 |
| WO | 2008/151915 | * | 12/2008 |

OTHER PUBLICATIONS

Hermans et al., "High aspect ratio surface relief structures by photoembossing", Appl. Phys. Lett., vol. 91 174103, 3 pages (2007).*
van Gorp, "Helices by hydrogen bonding" Thesis (2004).*
Lub et al., "Formation fo optical films by photopolymerisation of liquid crystalline acrylates . . . ", Mol. Cryst. Liq. Cryst., vol. 429, pp. 77-99 (2005).*
van der Zande et al., "Synthesis, properties, and photopolymerization of liquid crystalling oxetanes . . . " Adv. Chem. Mater., vol. 16 pp. 791-798 (2006).*
Masuda et al., "Self-assembled polymerization of columnar stackes of self assembled trialkyl-1,3,5-benzenetricarboxamide derivatives", JACS vol. 125(51) pp. 15935-15940 (2003).*
Sugita et al., "Electrical properties in disk-like phenylene derivative in crystalline state", Chem. Phys. Lett., vol. 396 pp. 131-135 (2004).*
Kato et al., "Liquid-crystalline physical gels", Chem. Soc. Rev., vol. 36 pp. 1857-1867 (2007).*
Hasabusa et al., "Development of organogelators—compounds which can harden oils and organic solvents", Hyomen, 36(6) pp. 219-303 (1998).*
Hanabusa et al., "Remarkable viscoelasticity of organic solvents containing trialkyl-1,3,5,benzenetricarboxamides and theier intermolecular hydrogen bonding", Chgem. Lett., vol. 197 pp. 429-430 (1997).*
International Search Report for PCT/EP2009/054161, mailed Aug. 6, 2009.
de Witz et al, "Photo-Embossing as a Tool for Creating Complex Surface Relief Structures," *Polymer Preprints*, vol. 44, No. 2, Aug. 1, 2003, pp. 236-237.

* cited by examiner

*Primary Examiner* — Martin Angebranndt
(74) *Attorney, Agent, or Firm* — Nixon & Vanderhye P.C.

(57) ABSTRACT

The invention relates to a photo-embossing process for the preparation of a polymeric relief structure comprising the steps of: a) coating a substrate with a coating composition comprising one or more radiation-sensitive ingredients and less than 30 wt % polymeric binder material; b) locally treating the coated substrate with electromagnetic radiation having a periodic, non-periodic or random radiation-intensity pattern, forming a latent image, at a temperature below a transition temperature of the coating composition; and c) polymerizing and/or crosslinking the resulting coated substrate, at a temperature above said transition temperature, wherein the transition temperature is a temperature that defines a transition of the coating composition between a state of high viscosity and low viscosity and wherein the coating composition comprises a compound A comprising at least one radiation curable group and a photoinitiator, the coating composition having a transition temperature between 30° C. and 120° C.

14 Claims, No Drawings

PROCESS FOR PREPARING A POLYMERIC RELIEF STRUCTURE

This application is the U.S. national phase of International Application No. PCT/EP2009/054161 filed 7 Apr. 2009 which designated the U.S. and claims priority to EP Patent Application No. 08103401.9 filed 7 Apr. 2008, the entire contents of each of which are hereby incorporated by reference.

The present invention relates to a process for the preparation of a polymeric relief structure by
- a) coating a substrate with a coating comprising one or more radiation-sensitive ingredients,
- b) locally treating the coated substrate with electromagnetic radiation having a periodic, non periodic or random radiation-intensity pattern, forming a latent image,
- c) polymerizing and/or crosslinking the resulting coated substrate.

Such a process, hereinafter also to be called "photo-embossing" is known from "photo-embossing as a tool for complex surface relief structures" De Witz, Christiane; Broer, Dirk J., Abstracts of Papers, 226$^{th}$ ACS National Meeting, New York, N.Y., United States, Sep. 7-11, 2003.

Polymers with a surface relief structure have a wide range of applications. For instance, such polymers used in optical systems for data transport, storage and displays are nowadays of great interest. By structuring the surface of a polymer film or layer, light that passes through these layers can be controlled. For instance if the surface structure contains small semi-sphere like elements a lens array is obtained that may focus transmitting light. Such an element is for instance useful in a backlight of a liquid crystal display to focus light on the transparent area of the display. For these types of applications it is often necessary to control the shape of the surface profiles down to the micrometer region. Also regular patterns of surface structures may diffract light such that a single beam, upon transmission, is split up in multiple beams that for instance can be used as beam splitter in telecommunication devices. Surface structures are also important to control reflection of light. This can successfully be applied to suppress specular reflection of a surface. This so-called anti-glare effect is for instance applied on the front screen of a television set, but it can also be used for applications such glazing, car finishes, etc. A polymer film, with well-defined surface profiles, may be provided with a conformal reflective film such as evaporated aluminum or sputtered silver. Incident light falling on this mirror is, upon reflection, distributed in space in a very controlled way. This is for instance used to make internal diffusive reflectors for reflective liquid crystal displays. Another application of surface profiles is for creating anti-fouling structures known as the Lotus effect. Thereto surface profiles with dimensions smaller than 1 micrometer are needed.

Electromagnetic-radiation induced polymerization, like UV photo-polymerization is a method to prepare devices from e.g. a mixture of two (meth)acrylate monomers and a photo-initiator. The polymerization reaction is initiated only in those regions where the UV light can activate the photo-initiator. In addition, it is possible to vary the light intensity spatially and vary the polymerization speed accordingly. Differences in the monomer reactivity, size or length, cross-linking ability, and energetic interaction result in gradients in the monomer chemical potentials. These chemical potentials form the driving force for monomer migration and for polymer swelling in the illuminated regions. The monomer diffusion coefficients determine the time-scale on which this migration takes place. Subsequently, uniform UV illumination with a higher intensity than during the patterned UV illumination is used to polymerize the entire film.

In specific cases, patterned UV photo-polymerization of a mixture of two liquid monomers results in a polymer relief structure. This can be done for example holographically or lithographically. Other methods to induce polymerization in a patterned way are based on writing with beams of electrons or ions. For holography, the interference pattern of two coherent light beams generates regions of high and low light intensity. For lithography, a photo-mask is used to produce these intensity differences. If for instance a striped mask is used, a grating is produced. If a mask with circular holes is used, a microlens structure is formed. Besides by creating a surface profile by material transport also refractive indices can be modulated. Differences in the refractive index are caused by lateral variations of monomer-unit concentrations in the polymer. Refractive index profile may further support the lens functions obtained from the surface geometries.

By using these techniques, it is possible to create phase and relief structures. It is also possible to design systems where the monomer migrates to the illuminated areas or away from it. Two mechanisms that describe the formation of the grating can be distinguished. Firstly, overall mass transport may occur, in which both monomers diffuse towards the illuminated regions. This is achieved by swelling of the growing polymer in the illuminated regions due to suction of monomers from the dark regions. This mechanism describes the formation of a relief grating. Secondly, if no swelling occurs, two-way diffusion, induced by differences in reactivity, describes the formation of a film with a flat surface, but a variation monomer unit concentration in the exposed and non-exposed areas. This mechanism describes the formation of a phase grating.

WO 2005/008321 describes a method to create surface structures by using a photopolymer composition that basically consists of a polymer, a monomer and an initiator. The polymer can be a single polymeric material but may also be a blend of more than one polymer. Similarly the monomer may be a single compound, but may also comprise several monomeric components. The initiator preferably is a photoinitiator that generates radicals upon exposure to UV-light. Alternatively, the photo-initiator generates cations upon exposure to UV light. The initiator may also be a mixture of a photoinitiator and a thermal initiator that generates radicals at elevated temperatures. This mixture is generally dissolved in an organic solvent in order to enhance processing, e.g. formation of thin films by spin coating. The blending conditions as well as the properties of the polymer and monomer are chosen such that after evaporation of the solvent a solid film is formed. In general this allows that upon patterned exposure with UV light a latent image is formed. The latent image can be developed into a surface profile by heating where polymerization and diffusion occur simultaneously, thus increasing the materials volume at the exposed area or vice versa which results in a surface deformation.

A weakness of this process is that the resulting relief structure, produced with such a photo-embossing process, has still a rather low aspect ratio that needs further improvement for certain applications. The aspect ratio (AR) is defined as the ratio between the relief height and structure width. As a result of which the optical function or other functionality that is aimed at is less optimal.

Recently, it has been reported by K. Hermans, F. K. Wolf, J. Perelaer, R. A. J. Janssen, U. S. Schubert, C. W. M. Bastiaansen, D. J. Broer, in *Appl. Phys. Lett.*, 2007, 91, 174103 that the structure height can be improved by adding molecules to the photopolymer composition which form stable radicals via an exchange mechanism with propagating radicals. These radicals act as latent initiators and can more easily re-initiate polymerization during development by chain transfer mechanisms in a densely crosslinked environment. As a result the difference in chemical potential between the exposed and non-exposed areas is increased, enhancing the diffusion of reactive species to the developing structures.

It is important in the above process that the film of photopolymer composition is not tacky and shows very little diffusion of reactive species, before exposure with UV light and further processing. Only when the temperature of the polymeric film is elevated (after the first exposure) mobility may increase and the polymeric relief structure is being formed. In the above process, a high amount (like for example 45 wt %) of unreactive polymer (or polymeric binder) is applied in order to obtain a solid film of photopolymer composition. The ratio between monomer and polymer determines the degree of solidification and the glass transition temperature of the photopolymer composition. The ratio between monomer and polymer also determines the maximum obtainable aspect ratio at a given coating layer thickness: to obtain a higher aspect ratio with the above described coating compositions, the coated layer thickness has to be increased. A way of increasing the aspect ratio at a given coating layer thickness, especially when a small coating layer thickness is desired, is increasing the ratio between monomer and polymer, e.g. by reducing the polymeric binder content of the coating composition. As a result the glass transition of the photopolymer composition may become below room temperature and the coated sample becomes tacky, which obstructs contact masking and leads to increased dust uptake during processing. Also, as a result of the reduced viscosity of the photopolymer composition, partial development of the relief structures occurs already during or just after the exposure step, but before applying the development step. This premature surface relief development deforms the optical path when applying multiple exposure steps to create a complex relief structure. Although a polymeric binder is necessary to ensure easy processing and allow multi exposure steps, the mobility of the polymeric binder is, even at elevated temperatures, low and does therefore not contribute to the height of the surface relief structure.

It is an object of the present invention to develop a process for making polymeric relief structures that can achieve high AR ratios.

It is another object of the invention to achieve a high AR ratio at a reduced layer thickness of the photopolymer composition applied on a substrate.

It is another objective of the invention to have a tack-free solid film prior to exposure yet having a high concentration of reactive material.

The present invention relates to a photo-embossing process for the preparation of a polymeric relief structure comprising the steps of:
  a) coating a substrate with a coating composition comprising one or more radiation-sensitive ingredients and less than 30 wt % polymeric binder material;
  b) locally treating the coated substrate with electromagnetic radiation having a periodic, non-periodic or random radiation-intensity pattern, forming a latent image, at a temperature below a transition temperature of the coating composition; and
  c) polymerizing and/or crosslinking the resulting coated substrate, at a temperature above said transition temperature,
  wherein the transition temperature is a temperature that defines a transition of the coating composition between a state of high viscosity and low viscosity and wherein the coating composition comprises a compound A comprising at least one radiation curable group and a photoinitiator, the coating composition having a transition temperature between 30° C. and 120° C.

A preferred embodiment of the present invention is a photo-embossing process for the preparation of a polymeric relief structure comprising the steps of:
  a) coating a substrate with a coating composition comprising one or more radiation-sensitive ingredients and less than 30 wt % polymeric binder material;
  b) locally treating the coated substrate with electromagnetic radiation having a periodic, non-periodic or random radiation-intensity pattern, forming a latent image, at a temperature below a transition temperature of the coating composition; and
  c) polymerizing and/or crosslinking the resulting coated substrate, at a temperature above said transition temperature,
  wherein the coating composition comprises a compound selected from the group consisting of tri(hexylacrylate)benzenetricarboxamide, 1,3,5-Tris-(3,4,5-tridodecyloxybenzoylamino)benzene, 1,3,5-Tris-[3,4,5-tris((S)-3,7-dimethyloctyloxy)benzoylamino]-benzene, N-(3,5-Bis-{3-[3,4,5-tris-((S)-3,7-dimethyloctyloxy)-phenyl]-ureido}-phenyl)-3,4,5-tridodecyloxy-benzamide, N-{3,5-Bis[3-(3,4,5-tridodecyloxyphenyl)-ureido]-phenyl}-3,4,5-tris-((S)-3,7-dimethyloctyloxy)-benzamide, 3,4,5-Tris-((S)-3,7-dimethyloctyloxy)-N-(3,5-dinitrophenyl)-benzamide, N-(3,5-Diamino-phenyl)-3,4,5-tridodecyloxy-benzamide, N-(3,5-Diamino-phenyl)-3,4,5-tris-((S)-3,7-dimethyloctyloxy)-benzamide and N-(5-sorbyl-pentyl)-N',N"-di(n-octyl)benzene-1,3,5-tricarboxamide.

This process has many advantages; one advantage is that a film can be prepared from a coating composition that can be processed as a solution, wherein the coating composition has a low amount of solvents, the composition has a high content of reactive ingredients thus improving on environmental properties, processing speed and price as solvent evaporation and emission is reduced.

The coating composition comprising compound A has a transition temperature between 30 and 120° C. The presence of compound A induces a change of the viscosity of the photopolymer coating composition upon raising the temperature: the viscosity changes from a highly viscous or solid to a low viscosity.

The coating composition of the present invention is solid or has a high viscosity at the temperature of step b) (which is for example ambient temperature) and has a low viscosity at the temperature of the development step c). Ambient temperature is about 25° C., a high viscosity is a viscosity of at least 100 Pa·s, preferably more than 1000 Pa·s and most preferably more than 10.000 Pa·s. At the temperature of the development step c), the viscosity of the coating preferably decreases more than 80%, more preferably 90% and most preferably 95% relative to the viscosity present in step b). Hence, the viscosity of the coating composition decreases to less than 20%, preferably less than 10%, more preferably less than 5% of its original value at the temperature of the development step c).

Due to polymerization and/or crosslinking of the reactive ingredients in the coating composition during the photo-embossing process according to the present invention, the viscosity of the reacting coating composition will gradually increase with the increasing degree of conversion of the reactive ingredients of the coating composition into a polymerized and/or crosslinked state. In the context of the present invention, the viscosities of the coating composition in steps b) and c) of the photo-embossing process therefore relate to the initial viscosities of the coating composition in said steps. These initial viscosities are determined by the viscosities of the coating composition at the temperatures of steps b) and c) respectively, on the coating composition that is not treated with electromagnetic radiation. The thus determined viscosities are independent of said degree of conversion of the reactive ingredients. Up to $10^7$ Pa·s, the viscosity is measured with a Wells-Brookfield rheometer with a cone and plate geometry. The unradiated coating composition is placed on a horizontal plate and a shallow cone is placed on it. The angle between the surface of the cone and the plate is in the order of 1 degree (i.e. it is a very shallow cone). The measurement set-up is then heated to the desired temperature, in particular the temperatures of steps b) and c), respectively, of the photo-embossing process of the present invention. Typically the plate is rotated and the torque on the cone is measured, from which torque the shear stress in the fluid is calculated. The shear rate is determined by the rotational speed and the cone dimensions. The ratio between the shear stress and the shear rate is a measure for the viscosity of the fluid at the measurement conditions, in particular the temperature. Because of the application as a coating, the viscosity of interest of the coating composition that is used in the photo-embossing process according to the present invention is the viscosity at low shear rates. The viscosities of the coating composition according to the above method are therefore measured at rotational speeds of the plate between 0.01 and 1.0 rpm, preferably between 0.01 and 0.5 rpm, more preferably between 0.01 and 0.1 rpm.

In a preferred embodiment of the present invention the compound A shows a transition between a highly viscous state and a low viscosity between ambient temperature and the temperature of the development step, measured with DSC. The transition between a state of high viscosity and low viscosity may for example be a melting temperature, crystallization temperature, glass transition temperature, isotropic temperature, depolymerization temperature of a (reversible) polymer or in the case of compounds with liquid crystalline properties, temperatures during which there is a change in mesophases such as nematic, smectic, cholesteric or columnar.

Preferably the coating composition contains said transition temperature between 40 and 120° C., more preferably between 50 and 90° C.

Most preferably the coating composition is a solid at the temperature of step b).

Examples of compound A that can have a transition between a state of high viscosity and a low viscosity above 25° C. are compounds such as hydrogen bonded reactive monomers. These monomers form a supramolecular polymer at room temperature, but are highly mobile at elevated temperatures. A supramolecular polymer is a polymer which is made out of repeating units that are held together by reversible non-covalent bonds (e.g. hydrogen bonds). Examples of hydrogen bonded reactive monomers are cyclohexanetricarboxamide-derivatives or benzenetricarboxamide-derivatives. Benzene tricarboxamides are known to be disc-like molecules, which can form rod-like aggregates via amide hydrogen bonds. The thus formed liquid-crystalline species are highly viscous or solid at room temperature, but have increased mobility at elevated temperatures when hydrogen bonds are broken and the supramolecular phase changes into a liquid phase. Thus, the use of these types of monomers obviates the needs for a polymeric binder, while the reactive acrylate groups readily polymerize to form a covalently bonded network by exposure to ultra violet (UV) light in the presence of a photo-initiator. Examples of benzenetricarboxamide-derivatives are tri(hexylacrylate) benzenetricarboxamide, 1,3,5-Tris-(3,4,5-tridodecyloxybenzoylamino) benzene, 1,3,5-Tris-[3,4,5-tris((S)-3,7-dimethyloctyloxy) benzoylamino]-benzene, N-(3,5-Bis-{3-[3,4,5-tris-((S)-3,7-dimethyloctyloxy)-phenyl]-ureido}-phenyl)-3,4,5-tridodecyloxy-benzamide, N-{3,5-Bis-[3-(3,4,5-tridodecyloxyphenyl)-ureido]-phenyl}-3,4,5-tris-((S)-3,7-dimethyloctyloxy)-benzamide, 3,4,5-Tris-((S)-3,7-dimethyloctyloxy)-N-(3,5-dinitrophenyl)-benzamide, N-(3,5-Diamino-phenyl)-3,4,5-tridodecyloxy-benzamide, N-(3,5-Diamino-phenyl)-3,4,5-tris-((S)-3,7-dimethyloctyloxy)-benzamide, N-(5-sorbyl-pentyl)-N',N"-di(n-octyl)benzene-1,3,5-tricarboxamide Other examples of compound A that can have a transition between a state of high viscosity and a low viscosity above 25° C. are compounds that form glassy state at room temperature due steric interactions. Such molecules contain at least one side group, but more commonly more than one side group, which sterically hinders the compound from crystallizing. When depositing such a compound for example from solution onto a substrate, a thin solid film is without the use of any polymeric binder. An example of such a molecule is SU-8, which is a commonly used epoxy-based negative photoresist.

Compound A can also be a mixture of different compounds which combined are characterized in that the mixture of said compounds is solid or has a high viscosity at ambient temperature and has a low viscosity at the temperature of the development step. Said mixture is further characterized in that it shows a transition between a highly viscous state and a low viscosity between ambient temperature and the temperature of the development step.

An initiator may preferably be present in the coating to initiate a polymerization and/or crosslinking reaction. The amount of initiator may vary between wide ranges. A suitable amount of initiator is for example between above 0.1 and 10 wt % with respect to total weight of the compounds that take part in the polymerization and/or crosslinking reaction.

When exposure to UV-light is used to initiate a polymerization and/or crosslinking reaction, the mixture preferably comprises a UV-photo-initiator. A photo-initiator is capable of initiating a polymerization and/or crosslinking reaction upon absorption of light; thus, UV-photo-initiators absorb light in the Ultra-Violet region of the spectrum. Any known UV-photo-initiators may be used in the process according to the invention.

Photoinitiators that absorb in the visible spectrum to generate reactive species can be applied as well.

Also the combination of a (UV) photoinitiator and a sensitizer may be used in order to make the formulation sensitive for larger wavelengths, e.g. in the green or red part of the visible spectrum where different laser systems emit. A sensitizer absorbs the light used for exposure, becomes excited and transfers the excitation energy to the photoinitiator which subsequently decomposes into the reactive species.

Preferably the polymerization initiator comprises a mixture of a photo initiator and a thermal initiator.

The coating composition may also contain a monomeric compound, being a compound of relatively low molecular weight, i.e. smaller than 1500 gram/mol, which compound upon contact with reactive particles, i.e. free radicals or cationic particles, polymerize. In a preferred embodiment the monomer or one of the monomers of a monomer mixture contains more than one polymerizing group such that upon polymerization a polymer network is formed. Further in the preferred embodiment the monomers are molecules containing one or more reactive groups of the following classes: vinyl, acrylate, methacrylate, epoxide, oxetane, vinylether, propenylether, thiol-ene or maleimide.

Examples of monomers suitable for use as polymerizing ingredient and having at least two crosslinkable groups per molecule include monomers containing (meth)acryloyl groups such as trimethylolpropane tri(meth)acrylate, pentaerythritol (meth)acrylate, ethylene glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, trimethylolpropanetrioxyethyl (meth)acrylate, tris(2-hydroxyethyl)isocyanurate tri(meth)acrylate, tris(2-hydroxyethyl)isocyanurate di(meth)acrylate, pentaerythritol tri (meth)acrylate, pentaerythritol tetra(meth)acrylate, dipentaerythritol monohydroxy pentacrylate, dipentaerythritol hexacrylate, tricyclodecane diyl dimethyl di(meth)acrylate and alkoxylated versions, preferably ethoxylated and/or propoxylated, of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, adduct of hydroxyethyl acrylate, isophorone diisocyanate and hydroxyethyl acrylate (HIH), adduct of hydroxyethyl acrylate, toluene diisocyanate and hydroxyethyl acrylate (HTH), and amide ester acrylate.

Examples of suitable monomers having only one crosslinking group per molecule include monomers containing a vinyl group, such as N-vinyl pyrrolidone, N-vinyl caprolactam, vinyl imidazole, vinyl pyridine; isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, benzyl (meth)acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth) acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth) acrylate, octyl (meth)acrylate, isooctyl (meth)acrylate, 2-ethylhexyl (meth)acrylate, nonyl (meth)acrylate, decyl (meth) acrylate, isodecyl (meth)acrylate, tridecyl (meth)acrylate, undecyl (meth)acrylate, lauryl (meth)acrylate, stearyl (meth) acrylate, isostearyl (meth)acrylate, tetrahydrofurfuryl (meth) acrylate, butoxyethyl (meth)acrylate, ethoxydiethylene glycol (meth)acrylate, benzyl (meth)acrylate, phenoxyethyl (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, beta-carboxyethyl (meth)acrylate, phthalic acid (meth)acrylate, isobutoxymethyl (meth)acrylamide, N,N-dimethyl (meth) acrylamide, t-octyl (meth)acrylamide, dimethylaminoethyl (meth)acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth)acrylate, N,N-diethyl (meth)acrylamide, N,N-dimethylaminopropyl (meth)acrylamide, hydroxybutyl vinyl ether, lauryl vinyl ether, cetyl vinyl ether, 2-ethylhexyl vinyl ether; and compounds represented by the following formula (I)

$$CH_2=C(R^6)-COO(R^7O)_m-R^8 \qquad (I)$$

wherein $R^6$ is a hydrogen atom or a methyl group; $R^7$ is an alkylene group containing 2 to 8, preferably 2 to 5 carbon atoms; and m is an integer from 0 to 12, and preferably from 1 to 8; $R^8$ is a hydrogen atom or an alkyl group containing 1 to 12, preferably 1 to 9, carbon atoms; or, $R^8$ is a tetrahydrofuran group-comprising alkyl group with 4-20 carbon atoms, optionally substituted with alkyl groups with 1-2 carbon atoms; or $R^8$ is a dioxane group-comprising alkyl group with 4-20 carbon atoms, optionally substituted with methyl groups; or $R^8$ is an aromatic group, optionally substituted with $C_1$-$C_{12}$ alkyl group, preferably a $C_8$-$C_9$ alkyl group, and alkoxylated aliphatic monofunctional monomers, such as ethoxylated isodecyl (meth)acrylate, ethoxylated lauryl (meth)acrylate, and the like.

Oligomers suitable for use as a radiation sensitive ingredient are for example aromatic or aliphatic urethane acrylates or oligomers based on phenolic resins (ex. bisphenol epoxy diacrylates), and any of the above oligomers chain extended with ethoxylates. Urethane oligomers may for example be based on a polyol backbone, for example polyether polyols, polyester polyols, polycarbonate polyols, polycaprolactone polyols, acrylic polyols, and the like. These polyols may be used either individually or in combinations of two or more. There are no specific limitations to the manner of polymerization of the structural units in these polyols. Any of random polymerization, block polymerization, or graft polymerization is acceptable. Examples of suitable polyols, polyisocyanates and hydroxylgroup-containing (meth)acrylates for the formation of urethane oligomers are disclosed in WO 00/18696, which is incorporated herein by reference.

Combinations of compounds that together may result in the formation of a crosslinked phase and thus in combination are suitable to be used as the reactive diluent are for example carboxylic acids and/or carboxylic anhydrides combined with epoxies, acids combined with hydroxy compounds, especially 2-hydroxyalkylamides, amines combined with isocyanates, for example blocked isocyanate, uretdion or carbodiimide, epoxies combined with amines or with dicyandiamides, hydrazinamides combined with isocyanates, hydroxy compounds combined with isocyanates, for example blocked isocyanate, uretdion or carbodiimide, hydroxy compounds combined with anhydrides, hydroxy compounds combined with (etherified) methylolamide ("amino-resins"), thiols combined with isocyanates, thiols combined with acrylates or other vinylic species (optionally radical initiated), acetoacetate combined with acrylates, and when cationic crosslinking is used epoxy compounds with epoxy or hydroxy compounds.

Further possible compounds that may be used as a radiation sensitive ingredient are moisture curable isocyanates, moisture curable mixtures of alkoxy/acyloxy-silanes, alkoxy titanates, alkoxy zirconates, or urea-, urea/melamine-, melamine-formaldehyde or phenol-formaldehyde (resol, novolac types), or radical curable (peroxide- or photo-initiated) ethylenically unsaturated mono- and polyfunctional monomers and polymers, e.g. acrylates, methacrylates, maleate/vinyl ether), or radical curable (peroxide- or photo-initiated) unsaturated e.g. maleic or fumaric, polyesters in styrene and/or in methacrylates.

The coating composition of the present invention may comprise a solvent. The solvent may be used for the application of the coating composition on the substrate, but is preferably removed from the applied coating composition before exposure of to UV light. In principle, a wide variety of solvents may be used. However, the combination of the solvents and all other materials present in the mixture should preferentially form stable suspensions or solutions.

Preferably the solvent used is evaporated after applying the coating onto the substrate (step (a)), but before step (b). In the process according to the invention, optionally the coating may after application to the substrate be heated or treated in vacuum to aid evaporation of the solvent.

Examples of solvents that are suitable are 1,4-dioxane, acetone, acetonitrile, chloroform, chlorophenol, cyclohexane, cyclohexanone, cyclopentanone, dichloromethane, diethyl acetate, diethyl ketone, dimethyl carbonate, dimethylformamide, dimethylsulphoxide, ethanol, ethyl acetate, m-cresol, mono- and di-alkyl substituted glycols, N,N-dimethylacetamide, p-chlorophenol, 1,2-propanediol, 1-pentanol, 1-propanol, 2-hexanone, 2-methoxyethanol, 2-methyl-2-propanol, 2-octanone, 2-propanol, 3-pentanone, 4-methyl-2-pentanone, hexafluoroisopropanol, methanol, methyl acetate, butyl acetate, methyl acetoacetate, methyl ethyl ketone, methyl propyl ketone, n-methylpyrrolidone-2, n-pentyl acetate, phenol, tetrafluoro-n-propanol, tetrafluoroisopropanol, tetrahydrofuran, toluene, xylene and water. Alcohol, ketone and ester based solvents may also be used, although the solubility of acrylates may become an issue with high molecular weight alcohols. Halogenated solvents (such as dichloromethane and chloroform) and hydrocarbons (such as hexanes and cyclohexanes), are suitable.

The coating composition can contain a polymeric material. In fact each polymer can be used that forms a homogenous mixture with the other components. Well-studied polymers are polymethylmethacrylate, polymethylacrylate, polystyrene, polybenzylmethacrylate, polyisobornylmethacrylate. But also many other polymers may be applied as well. Preferably the amount of polymeric material is less than 30 wt % of the total composition, more preferably less than 10 wt %, even more preferably less than 5 wt % of the total of the composition. Most preferably the coating composition does not contain a polymeric binder material. Preferably, this polymer has a viscosity-averaged molecular weight (Mv) of at least 20,000 g/mol. The viscosity average molecular weight of the polymer preferably ranges between $10^5$ and $10^7$. The viscosity average molecular weight of the polymer is calculated from the Mark-Houwink equation:

$$[\eta]=KMW^a$$

The values for the constants K and a can be found in literature, like for example the Polymer Data Handbook, edited by James E. Mark, published by Oxford University Books (1999), (http://www.gmc.ufsc.br/~minatti/docs/20061/polymer_data_handbook.pdf).

The polymer, when used in the coating step a), preferably has a glass transition temperature of at least 300 K. Preferably, the polymer in the coating used in step a) is dissolved in the monomer(s), present in the radiation sensitive coating of step a) or in the solvent used in the coating of step a) of the process of the present invention.

The coating composition may contain a RAFT agent. RAFT agents have been disclosed in several references, like for example WO99/31144, or Polymer International 49:993-1001 (2000). In these publications the RAFT agents are used for the controlled radical polymerization of different monomers. The presence of the RAFT agent in the process of the invention may further improve the AR of the polymeric relief structures to be made.

The RAFT agents to be used in the present invention have the general structure according to formula II:

Formula (II)

wherein R=substituted or unsubstituted aryl or alkyl groups; Z=organic group having from 1 to 100 C-atoms and optionally heteroatoms like O, N, S, P, Si. Examples of organic groups Z are alkyl group, arylgroup, thiol, amine, pyrrole, pyridine and alkoxy.

In a preferred embodiment of the invention R is a compound having the formula —C—(R1)$_2$—Y, wherein R1 is an alkylgroup, like a methyl, ethyl, propyl, isopropyl, butyl group, and Y is an aromatic group, like a phenyl, tolyl, naphtyl group, a CN, an ether group or an estergroup. More preferably R is a —C—(CH$_3$)$_2$—CN, —C—(CH$_3$)$_2$—Y2 group, wherein Y2 is a phenyl, tolyl or naphtylgroup, or a —C—(CH$_3$)$_2$—COOR2 group, wherein R2 is a C$_1$-C$_{10}$ substituted or unsubstituted alkyl group. Most preferably R is selected from the group consisting of —C—(CH$_3$)$_2$—CN, —C—(CH$_3$)$_2$-phenyl, —C—(CH$_3$)$_2$-tolyl, and —C—(CH$_3$)$_2$—COOR3, wherein R3 is methyl, ethyl, propyl or butyl.

Z may preferably be selected from the group consisting of phenyl, tolyl, naphtyl, thiol, alkyl having from 1 to 10 carbon atoms, and pyrrol groups. More preferably Z is an aromatic group having from 6 to 20 carbon atoms. Most preferably, Z is a phenyl or tolyl group.

The amount of RAFT agent that can be used in the present invention generally lies between 0.1 and 20 weight %, relative to the total of the composition.

The coating composition may contain an organic radical scavenger. Organic radical scavengers are known to the skilled man in the art. They may also be known as inhibitors or retarders. Non limiting examples of suitable organic radical scavengers are phenols, (like for example hydroquinone, monomethylhydroquinone, 3,5-t-butylcatechol, t-butyl hydroquinone, α-naphtol, 2-nitro-α-naphtol, β-naphtol, 1-nitro-β-naphtol, phenol, 2,4-dinitrophenol, o-nitrophenol, m-nitrophenol, p-nitrophenol, hydroquinone mono methyl, di-tert-butylhydroquinone, tertiairbutylhydroquine, tetrafluorohydroquinone, trimethylhydroquinone); Quinones, (like for example p-benzoquinone, chloro-p-benzoquinone, 2,5-dichloro-p-benzoquinone, 2,6-dichloro-p-benzoquinone, 2,3-dimethyl-p-benzoquinone, 2,5-dimethyl-p-benzoquinone, methoxy-p-benzoquinone, methyl-p-benzoquinone, tetrabromo-p-benzoquinone, tetrachloro-p-benzoquinone, tetra-iodo-p-benzoquinone, tetramethyl-p-benzoquinone, trichloro-p-benzoquinone, trimethyl-p-benzoquinone); Nitrones, nitro- and nitroso-compounds (like for example o-dinitrobenzene, m-dinitrobenzene, p-dinitrobenzene, nitrobenzene, nitro-d5-benzene, p-nitro-chlorobenzene, 1,3,5-trinitrobenzene, p-nitrobenzoic acid, nitrodiphenyl, diphenylpicrylhydrazyl, dinitrodurene, 1,5-dinitronaphthalene, picramide, picric acid, picryl chloride, 2,4-dinitrotoluene, o-nitrotoluene, m-nitrotoluene, p-nitrotoluene, 1,3,5-trinitrotoluene); Captodative olefins: stable radicals (like for example acetophenone, aniline, bromobenzene, diazoaminobenzene, benzoic acid, benzoic acid ethyl ester, benzophenone, benzoyl chloride, diphenyl, diphenyl amine, durene, fluorine, triphenylmethane, naphthalene, phenanthrene, stilbene, sulfur, toluene, p-bromotoluene, tolunitrile, p-xylene); 1,1 diphenyl-2-picrylhydrazyl (DPPH).

The organic radical scavengers can be present in an amount up to 20 wt %, for example in an amount ranging from 0.5-18 wt %, or between 2-16 wt %, alternatively between 6 and 14 wt % (relative to the coating composition except for the solvent).

A linemask with fillfactor 0.5 is a mask comprising parallel lines, wherein 50% of the surface is non-transparent.

The coating composition may be applied onto the substrate by any process known in the art of (wet) coating deposition. Examples of suitable processes are spin coating, dip coating, spray coating, flow coating, meniscus coating, doctor's blading, capillary coating, and roll coating.

Typically, the radiation sensitive ingredients are mixed, preferably with at least one solvent and crosslinking initiator to prepare a mixture that is suitable for application to the substrate using the chosen method of application.

A wide variety of substrates may be used as a substrate in the process according to the invention. Suitable substrates are for example flat or curved, rigid or flexible polymeric substrates, including films of for example polycarbonate, polyester, polyvinyl acetate, polyvinyl pyrollidone, polyvinyl chloride, polyimide, polyethylene naphthalate, polytetrafluoro-ethylene, nylon, polynorbornene or amorphous solids, for example glass or crystalline materials, such as for example silicon or gallium arsenide. Metallic substrates may also be used. Preferred substrates for use in display applications are for example glass, polynorbornene, polyethersulfone, polyethyleneterephtalate, polyimide, cellulose triacetate, polycarbonate and polyethylenenaphthalate.

In step a) of the process of the present invention, the coating composition may be applied onto the substrate by any process known in the art of (wet) coating deposition. Examples of suitable processes are spin coating, dip coating, spray coating, flow coating, meniscus coating, doctor's blading, capillary coating, and roll coating. The coating process may be supported by moderately heating the substrate or coating composition, for example to evaporate any solvent that may be present.

In step b) of the process of the present invention the coated substrate resulting from process step a) is locally treated with electromagnetic radiation having a periodic or latent radiation intensity patterning as a result of which a latent image is formed. In one preferred embodiment, this treatment is performed using UV-light in combination with a mask. In another preferred embodiment, this treatment is performed by the use of light interference/holography. Still another embodiment is by the use of electron beam lithography. In case electron beam lithography is used, the photoinitiator may be absent, since the electronbeam has sufficient energy to initiate the polymerization of compound A and/or monomers.

The treatment of the composition with electromagnetic radiation induces the formation of active species like radicals or cations that can start the crosslinking through for example a free radical mechanism or by a cationic mechanism, or a combination thereof.

In Step c) the coated composition is heated to start or enhance the polymerization at the exposed areas and to induce the diffusion of monomer to these areas from the unexposed areas. During heating the earlier defined transition temperature is passed, whereby the viscosity of the composition is reduced and materials transport is facilitated.

An optional step d) may be present wherein the sample receives a postcuring step either by UV light, by heat or a combination of both to ensure complete polymerization of the radiation sensitive composition.

The essential feature of the present invention is the use of compound A, while the amount of polymer used as binder is low, or the polymeric binder is absent, for generating relief structures with a high aspect ratio.

The conditions under which the process steps a)-d) have to be performed, are as such known in the art of radiation polymerization. As temperatures for said process steps preferably a temperature of between 250 and 320 K is used for step b), more preferably step b) is performed at ambient temperature, and preferably a temperature of between 325 and 450 K is used for step c).

The polymeric relief structures of the present invention have an improved aspect ratio. The aspect ratio (AR, being the ratio between the relief height and structure width, both in $\mu m$) of the reliefs of the invention is in general at least 0.05, and more preferably at least 0.075; even more preferably, the AR is at least 0.1 when using a coating with a thickness of 3 $\mu m$. The thickness of the coating has an important effect on the AR and when comparing systems it should always be similar.

Surprisingly, the process of the present invention allows for making structures having a high AR-ratio at relatively thin layers of photopolymer composition applied on a substrate. This gives the advantage that transparency of the polymeric relief structures is improved, less material is needed to make the polymeric relief structures, and the time for making the relief structures is shortened.

The AR-ratio at a certain layer thickness is expressed as the relative aspect ratio (AR(relative)) and is defined as the height (h) divided by the width (w) of a structure normalized by the layer thickness (l).

$$AR(\text{relative}) = \frac{(h/w)}{l}$$

Conventional photopolymers known from prior art have an AR(relative) of typically $1.33 \times 10^{-2}$ $\mu m^{-1}$ for a 20 $\mu m$ wide structure (h=0.8 $\mu m$, l=3 $\mu m$). When adding RAFT or a radical scavenger to the photopolymer composition the AR(relative) can be further enhanced to typically $1.88 \times 10^{-2}$ $\mu m^{-1}$ for a 20 $\mu m$ wide structure (h=6 $\mu m$, l=16 $\mu m$). In a photopolymer according to the invention the AR(relative) is typically $3.5 \times 10^{-2}$ $\mu m^{-1}$ for a 20 $\mu m$ wide structure (h=2.1 $\mu m$, l=3 $\mu m$). The relative aspect ratios of polymeric relief structures prepared with a photo-embossing process according to the present invention exceed the AR(relative) of relief structures known from the prior art. Polymeric relief structure prepared with a photo-embossing process according to the present invention have an AR(relative) of at least $2.8 \times 10^{-2}$ $\mu m^{-1}$, preferably at least $3.0 \times 10^{-2}$ $\mu m^{-1}$, more preferably at least $3.2$ $\mu m^{-1}$ and most preferably at least $3.4 \times 10^{-2}$ $\mu m^{-1}$. For a 20 $\mu m$ wide structure, the height of the polymeric relieve structure is at least 55%, preferably at least 60%, more preferably at least 65% and most preferably at least 70% of the original coating layer thickness. For the above given case (h=2.1 $\mu m$, l=3 $\mu m$) the height of the relief structure is 70% of the original coating layer thickness.

The present invention also relates to articles comprising a polymeric relief structure prepared with a photo-embossing process according to the present invention. Such articles are applicable in for example optical components. Examples thereof are quarter wave films and wire grid polarizes for applications in, e.g. LCD's or LED's. Also moth eye or lotus flower structures for self-cleaning surfaces are attainable herewith. Another and preferred embodiment is the use of the polymeric relief structure as a master for replication purposes in organic or inorganic matter. Other applications comprise Anti reflective/anti glare layers; vertically aligned displays (where photo-embossing is used to create the protrusions for alignment of the LCs); Microlenses; Reflectors, transflectors; polarizers; protein arrays, DNA arrays and microcontact printing.

The polymeric relief structures of the present invention can also be used to prepare an electronic or optical device wherein the polymer is used to protect a substrate for a subsequent edging step, after which edging the polymeric relief structure can be removed from the substrate leaving behind a structure in the substrate.

The invention is further elucidated with the following Examples and comparative experiments, which are not meant to restrict the invention.

EXAMPLE 1

An example of a photopolymer according to the invention is based on hydrogen bonding reactive species which transition from a quasi-solid supramolecular to a liquid phase. These molecules show this particular transition at 113° C. Therefore the developing temperature used in this example is 115° C. At this temperature the reactive species have low viscosity and can easily diffuse.

The hydrogen bonding reactive species (tri(hexylacrylate) benzene-tricarboxamides) were synthesized by reaction of benzene 1,3,5-tricarboxylic acid chloride and aminohexylacrylate, which was prepared as follows: to a 40 mL $CH_2Cl_2$ solution of aminohexanol (5.0 g, 43 mmol), di-tert-butyl dicarbonate (10 g, 46 mmol) was added slowly. After 3 h of additional stirring, 7 mL of triethylamine was added and subsequently 4 mL of acryloyl chloride was added dropwise, while cooling in an ice bath. After stirring for 3 hours at room temperature the solution was filtered, and 100 mL of $CH_2Cl_2$ was added. The organic layer was washed with 1 M HCl and 1 M NaOH aqueous solutions and dried over $MgSO_4$. After removal of $MgSO_4$, solvents were evaporated to give the N-Boc-aminohexylacrylate as colorless oil. (9.5 g, 81%). Aminohexylacrylate hydrochloride was obtained after reaction with 2 M HCl diethylether solution and was used for further reaction without purification. Aminohexylacrylate hydrochloride (1.5 g, 7.2 mmol) and benzene 1,3,5-tricarboxylic acid chloride (0.50 g, 1.9 mmol) were dissolved in 10 mL of $CH_3Cl$. To the mixture, triethylamine (1.0 g, 10 mmol) was added dropwise, while cooling in an ice bath. Stirring for 30 minutes was followed by addition of 100 mL $CHCl_3$ and the product was subjected to column chromatography with a chloroform/acetone gradient ($CHCl_3 \rightarrow CHCl_3$/acetone 3:1 v/v): yield 0.55 g (43%).

$^1$H NMR (400 MHz, $CDCl_3$): δ=8.19 (s, 3H, Ph-H), 7.43 (t, 3H, —NH—), 6.4–5.8 (m, 9H, acrylate), 4.13 (t, 6H, $CH_2CO$), 3.38 (m, 6H, —$CH_2NH$—), 1.7–1.4 (m, 24H, other $CH_2$); $^{13}$C NMR (100 MHz, $CDCl_3$): δ=166.6, 135.6, 130.9, 128.7, 128.3, 64.6, 40.3, 29.5, 28.6, 26.7, 25.7. MALDI-TOF MS: Calculated: 669.36, found: 692.30 ($[M+Na]^+$)

To create a solid thin film the hydrogen bonded reactive species were dissolved in chloroform in a 1:4 weight ratio. Different concentrations of initiator (Irgacure 819-Ciba Specialty Chemicals) were added to this mixture. Next a solid film was created on a glass substrate (10×10 cm) by doctor blading the solution using an Erichsen Coatmaster 509MC-1 with a 20 μm spaced custom build blade. The custom built blade consisted of a rectangular stainless steel block with an outer circumference of 8×6 cm and an inner opening of 5×1.4 cm. The block is designed such that the two 6 cm sides are 20 μm thicker than the 8 cm sides and support the block once positioned on a substrate. A film is created by placing a few drops of solution in the inner opening and moving the block with a constant speed of 25 mm/s across the substrate. The obtained film was dried for 30 minutes at room temperature to remove any residual solvent, resulting in a dry film of approximately 3 μm. Next, the samples were UV mask exposed using an EXFO OmniCure s-2000 light source and a 40 μm periodic line mask. To vary the intensity a linearly variable neutral density filter with the optical density ranging from 0.24, 0.53, 1.37, 2.22 and 2.31 J/cm$^2$ was placed on top of the line mask during exposure. After mask exposure the samples were gradually heated to 115° C. at which they were kept for a total of 20 minutes. In a final step the samples were flood exposed for 5 minutes with an intensity of 25 mW/cm$^2$ and cooled to room temperature.

The structure height was investigated with a Sensofar Plμ2300 confocal microscope with 50× objective.

The DSC measurements were performed with a TA Q1000 with a heating rate of 10° C./min. The measurements consist 2 heating/cooling cycles ranging from −40 to 140° C. and the data obtained by the second run is used.

The measured AR(relative) of the relief structures are given in Table 1. The maximum AR was approximately 0.11, which corresponds to a maximum AR(relative) of $3.6 \times 10^{-2}$ μm$^{-1}$ (original coating layer thickness is 3 μm), which in turn corresponds to a structure height of 2.16 μm with a structure width of 20 μm. The structure height is 72% of the original layer thickness.

TABLE 1

AR(relative) of structures according the comparative example 3 and example 1.

| | Exposure dose [J/cm$^2$] | | | | |
|---|---|---|---|---|---|
| | 0.24 | 0.53 | 1.37 | 2.22 | 2.31 |
| AR(relative) comparative example 1 [μm$^{-1}$] | $0.3 \times 10^{-2}$ | $0.7 \times 10^{-2}$ | $1.0 \times 10^{-2}$ | $1.0 \times 10^{-2}$ | $0.7 \times 10^{-2}$ |
| AR(relative) comparative example 2 [μm$^{-1}$] | $0.7 \times 10^{-2}$ | $0.4 \times 10^{-2}$ | $0.2 \times 10^{-2}$ | $0.2 \times 10^{-2}$ | $0.2 \times 10^{-2}$ |
| AR(relative) comparative example 3 [μm$^{-1}$] | $0.2 \times 10^{-2}$ | $0.2 \times 10^{-2}$ | $0.3 \times 10^{-2}$ | $0.2 \times 10^{-2}$ | $0.2 \times 10^{-2}$ |
| AR(relative) example 1 [μm$^{-1}$] | $3.6 \times 10^{-2}$ | $2.6 \times 10^{-2}$ | $2.0 \times 10^{-2}$ | $1.3 \times 10^{-2}$ | $1.6 \times 10^{-2}$ |

COMPARATIVE EXAMPLE 1

Photopolymer Present in Air, Thin Layer

The photopolymer consisted of a mixture containing: 50 wt % of polymer, polybenzylmethacrylate (Mw=70 kg/mol), and 50 wt % of a multifunctional monomer, di-penta erythritol penta/hexa acrylate. To the photopolymer was added 5 wt % of a photo-initiator (Irgacure 819). The mixture of photopolymer and photoinitiator was dissolved in 66 wt-% of a 1:1 mixture of propylene glycol methyl ether acetate and ethoxypropylacetate. From now on this mixture will be called the photopolymer solution.

The photopolymer solution is spin-coated onto a glass substrate at 800 RPM. After spin-coating, the sample is heated to 80° C. for 20 minutes in order to remove residual traces of solvent resulting in a film of approximately 3 μm thickness.

Then a photo mask with a grating of 40 μm (fill-factor 0.5) was used in direct contact with the solid polymer film. An exposure to ultra-violet light (EXFO OmniCure™ Series 2000, Photonic Solutions Inc.) was performed, with an energy dose which was ranging from 0.24, 0.53, 1.37, 2.22 and 2.31 J/cm$^2$. After exposure to UV light, the sample was heated to 115° C. for 20 minutes to generate the relief structures. Finally a flood exposure was performed with a UV lamp (E=0.8 J/cm$^2$) at 115° C. to fix the sample.

The final formed relief structures were characterized by white light scanning confocal microscopy (PLμ2300, Sensofar) using a 50× objective. The AR(relative) of the relief structures are given in Table 1. The maximum AR(relative) was approximately $1.0 \times 10^{-2}$ μm$^{-1}$.

COMPARATIVE EXAMPLE 2

Photopolymer Present in Air, Thick Layer

The photopolymer consisted of a mixture containing: 50 wt % of polymer, polybenzylmethacrylate (Mw=70 kg/mol), and 50 wt % of a multifunctional monomer, di-penta erythritol penta/hexa acrylate. To the photopolymer was added 5 wt % of a photo-initiator (Irgacure 819). The mixture of photopolymer and photoinitiator was dissolved in 50 wt-% of a 1:1 mixture of propylene glycol methyl ether acetate and ethoxypropylacetate. From now on this mixture will be called the photopolymer solution.

The photopolymer solution is spin-coated onto a glass substrate at 800 RPM. After spin-coating, the sample is heated to 80° C. for 20 minutes in order to remove residual traces of solvent resulting in a film of approximately 16 μm thickness.

Then a photo mask with a grating of 40 μm (fill-factor 0.5) was used in direct contact with the solid polymer film. An exposure to ultra-violet light (EXFO OmniCure™ Series 2000, Photonic Solutions Inc.) was performed, with an energy dose which was ranging from 0.24, 0.53, 1.37, 2.22 and 2.31 J/cm$^2$. After exposure to UV light, the sample was heated to 115° C. for 20 minutes to generate the relief structures. Finally a flood exposure was performed with a UV lamp (E=0.8 J/cm$^2$) at 115° C. to fix the sample.

The final formed relief structures were characterized by white light scanning confocal microscopy (PLμ2300, Sensofar) using a 50× objective. The AR(relative) of the relief structures are given in Table 1. The maximum AR(relative) was approximately $0.7 \times 10^{-2}$ μm$^{-1}$.

COMPARATIVE EXAMPLE 3

Photopolymer Present in Nitrogen, Thick Layer

The experimental conditions of comparative example 2 were used. Both during the illumination and during the heating step, the film kept under a nitrogen atmosphere. The height of the structures was determined using an optical profilometer and the AR(relative) are shown below in Table 1. The maximum AR(relative) was approximately $0.3 \times 10^{-2}$ μm$^{-1}$.

The invention claimed is:
1. A photo-embossing process for the preparation of a polymeric relief structure comprising the steps of:
    a) coating a substrate with a coating composition comprising at least one radiation-sensitive component and less than 30 wt % of a polymeric binder material, wherein the coating composition has a transition temperature between 30° C. and 120° C. that defines a transition of the coating composition between a high viscosity state and low viscosity state;
    b) locally treating the composition coated onto the substrate at a temperature below a transition temperature thereof with electromagnetic radiation having a periodic, non-periodic or random radiation-intensity pattern thereby forming non-treated areas of the composition and treated areas of the composition corresponding to a latent image of the polymeric relief structure; and
    c) polymerizing and/or crosslinking the resulting radiation treated composition coated onto substrate at a temperature above the transition temperature thereof to thereby form a polymeric relief structure having an aspect ratio (AR) of at least 0.05 from the latent image thereof, wherein
    step a) includes incorporating into the coating composition hydrogen bonded reactive monomers comprising at least one radiation curable group as the at least one radiation sensitive component, wherein the hydrogen bonded reactive monomers form a supramolecular polymer at room temperature made out of repeating units that are held together by reversible non-covalent bonds, and are highly mobile at elevated temperature, and wherein the hydrogen bonded reactive monomers are selected from the group consisting of tri(hexylacrylate) benzenetricarboxamide, 1,3,5-Tris-(3,4,5-tridodecyloxybenzoylamino)benzene, 1,3,5-Tris[3,4,5-((S)-3,7-dimethyloctyloxy)benzoylamino]benzene, N-(3,5-Bis-{3-[3,4,5-tris-((S)-3,7-dimethyloctyloxy)-phenyl]-ureido}-phenyl)-3,4,5-tridodecyloxy-benzamide, N-{3,5-Bis-[3-(3,4,5-tridodecyloxphenyl)-ureido]-phenyl}-3,4,5-tris-((S)-3,7-dimethyloctyloxy)-benzamide, 3,4,5-Tris-((S)-3,7-dimethyloctyloxy)-N-(3,5-dinitrophenyl)-benzamide, N-(3,5-Diamino-phenyl)-3,4,5-tridodecyloxy-benzamide and N-(3,5-Diamino-phenyl)-3,4,5-tris-((S)-3,7-dimethyloctyloxy)-benzamide.

2. The process according to claim 1, wherein the coating composition comprises less than 10 wt % of the total composition of the polymeric binder material.

3. The process according to claim 1, wherein the coating composition has a viscosity of more than 1000 Pa·s in step b).

4. The process according to claim 1, wherein the coating composition is a solid in step b).

5. The process according to claim 1, which comprises decreasing a viscosity of the coating composition in step c) to less than 20% of the viscosity of the coating composition in step b).

6. The process according to claim 1, wherein the composition comprises between 0.1 and 10 wt %, relative to the total weight of the compounds that take part in the polymerization and/or crosslinking reaction, of a radical photoinitiator.

7. The process according to claim 1, wherein the coating composition comprises at least one other monomer, which is a molecule containing one or more reactive groups selected from vinyl groups, acrylate groups, methacrylate groups, epoxide groups oxetane groups, vinylether groups, propenylether groups, thiol-ene groups or maleimides groups.

8. The process according to claim 1, wherein the coating composition comprises between 0.1 and 20 weight %, relative to total weight of the composition, of a RAFT agent.

9. The process according to claim 1, wherein the coating composition comprises between 2 and 16 weight %, relative to total weight of the composition except for the solvent, of an organic radical scavenger.

10. The process according to claim 1, wherein the aspect ratio of the relief structure is at least 0.075.

11. The process according to claim 1, wherein the aspect ratio of the relief structure is at least 0.1.

12. An article comprising a polymeric relief structure as prepared according to a process as claimed in claim 1, the polymeric relief structure having a relative aspect ratio (AR (relative)) of at least $3\times10^{-2}$ $\mu m^{-1}$.

13. The article according to claim 12, wherein the article is a quarter wave film or a wire grid polarizer for application in liquid crystal displays or light emitting diodes, a moth eye or lotus flower structure for self-cleaning surfaces, or a master for replication purposes in organic or inorganic matter.

14. The article according to claim 12, wherein the article is used as anti reflective/anti glare layers; vertically aligned displays, Microlenses, reflectors, transflectors, polarizers, protein arrays, DNA arrays or microcontact printing.

* * * * *